United States Patent
Schier et al.

(10) Patent No.: US 9,476,114 B2
(45) Date of Patent: Oct. 25, 2016

(54) TIALN-COATED TOOL

(71) Applicant: Walter AG, Tübingen (DE)

(72) Inventors: Veit Schier, Leinfelden-Echterdingen (DE); Ulrich Albers, Starzach-Börstingen (DE)

(73) Assignee: Walter AG, Tübingen (DE)

( * ) Notice: Subject to any disclaimer, the term of this patent is extended or adjusted under 35 U.S.C. 154(b) by 0 days.

(21) Appl. No.: 14/417,274

(22) PCT Filed: Jul. 23, 2013

(86) PCT No.: PCT/EP2013/065550
§ 371 (c)(1),
(2) Date: Jan. 26, 2015

(87) PCT Pub. No.: WO2014/019897
PCT Pub. Date: Feb. 6, 2014

(65) Prior Publication Data
US 2015/0211105 A1    Jul. 30, 2015

(30) Foreign Application Priority Data

Aug. 3, 2012 (DE) ........................ 10 2012 127 129

(51) Int. Cl.
| | | |
|---|---|---|
| B32B 19/00 | (2006.01) | |
| B32B 19/04 | (2006.01) | |
| B32B 3/00 | (2006.01) | |
| C23C 14/06 | (2006.01) | |
| C23C 14/32 | (2006.01) | |
| C23C 28/04 | (2006.01) | |
| C23C 28/00 | (2006.01) | |

(52) U.S. Cl.
CPC ......... *C23C 14/0641* (2013.01); *C23C 14/325* (2013.01); *C23C 28/042* (2013.01); *C23C 28/044* (2013.01); *C23C 28/42* (2013.01); *Y10T 428/2495* (2015.01); *Y10T 428/24355* (2015.01); *Y10T 428/24975* (2015.01); *Y10T 428/265* (2015.01); *Y10T 428/31678* (2015.04)

(58) Field of Classification Search
None
See application file for complete search history.

(56) References Cited

U.S. PATENT DOCUMENTS

| | | | |
|---|---|---|---|
| 4,842,710 A | 6/1989 | Freller et al. | |
| 6,033,734 A * | 3/2000 | Muenz et al. | 427/309 |
| 6,250,855 B1 | 6/2001 | Persson et al. | |
| 6,265,337 B1 * | 7/2001 | Kukino | C04B 35/5831 501/96.1 |
| 7,767,319 B2 | 8/2010 | Åkesson et al. | |
| 2005/0129986 A1 | 6/2005 | Sata et al. | |
| 2005/0170162 A1 | 8/2005 | Yamamoto et al. | |
| 2008/0075543 A1 * | 3/2008 | Zhu et al. | 407/119 |
| 2010/0190032 A1 | 7/2010 | Kathrein | |
| 2011/0081539 A1 | 4/2011 | Ni et al. | |

FOREIGN PATENT DOCUMENTS

| | | |
|---|---|---|
| CA | 2 600 097 A1 | 2/2009 |
| DE | 41 15 616 C2 | 11/1994 |
| DE | 100 61 436 A1 | 6/2002 |
| DE | 10 2005 063 421 B4 | 9/2010 |
| EP | 0 284 854 B1 | 5/1991 |
| EP | 1 038 989 A2 | 9/2000 |
| EP | 1 801 260 B1 | 2/2011 |
| EP | 2 298 954 A1 | 3/2011 |
| JP | H07-97679 A | 4/1995 |
| JP | H08-296064 A | 11/1996 |
| JP | H11-61380 A | 3/1999 |
| WO | 96/23911 A1 | 8/1996 |
| WO | 2006/041367 A1 | 4/2006 |
| WO | 2007/140888 A1 | 12/2007 |

OTHER PUBLICATIONS

International Preliminary Report on Patentability dated Feb. 3, 2015, for the corresponding International application No. PCT/EP2013/065550.
International Search Report and Written Opinion dated Dec. 13, 2013 for International application No. PCT/EP2013/065550.
German Search Report in DE 10 2012 107 129.2 dated Mar. 22, 2013.

* cited by examiner

*Primary Examiner* — David Sample
*Assistant Examiner* — Nicole T Gugliotta
(74) *Attorney, Agent, or Firm* — Morgan, Lewis & Bockius LLP

(57) ABSTRACT

Tool comprising a base body made of hard metal, cermet, ceramics, steel or high-speed steel and a single-layer or multi-layer anti-wear protective coating applied thereon in the PVD process, at least one layer of said anti-wear protective coating being a titanium-aluminum-nitride layer, $Ti_xAl_yN$ where $x+y=1$, which layer can contain, according to the process, up to 5% by weight of further metals, characterized in that the $Ti_xAl_yN$ layer is a multi-coat substructure having a plurality of periodically alternating $Ti_{x(A)}Al_{y(A)}N$ coats (A) where $x(A)+y(A)=1$ and $Ti_{x(B)}Al_{y(B)}N$ coats (B) where $x(B)+y(B)=1$, the Al concentration $y(B)$ in coats (B) amounting at most to 70 at. % ($y(B)$ 0.70) and the Al concentration $y(B)$ in coats (B) being from 10 to 25 at. % higher than the Al concentration $y(A)$ in coats (A) ($y(B)=(y(A)+0.10)$ to $(y(A)+0.25)$).

13 Claims, No Drawings

TIALN-COATED TOOL

RELATED APPLICATIONS

The present application is a U.S. National Phase Application of International Application No. PCT/EP2013/065550, filed 23 Jul. 2013, which claims priority to German Application No. 10 2012 107 129.2, filed 3 Aug. 2012.

SUBJECT-MATTER OF THE INVENTION

The invention relates to a tool comprising a base body made of hard metal, cermet, ceramics, steel or high-speed steel and a single-layer or multi-layer anti-wear protective coating applied thereto in the PVD process, at least one layer of said anti-wear protective coating being a titanium-aluminium-nitride layer, $Ti_xAl_yN$ where $x+y=1$.

BACKGROUND OF THE INVENTION

Cutting tools, in particular metal cutting tools, consist of a base body which is produced for example from hard metal, cermet, ceramics, steel or high-speed steel. To increase the tool life or to improve the cutting characteristics, a single-layer or multi-layer anti-wear protective coating made of hard materials is often applied to the base body by CVD or PVD processes. In PVD processes, a distinction is made between different process variants such as magnetron sputtering, arc evaporation (arc PVD), ion plating, electron beam evaporation and laser ablation. Magnetron sputtering and arc evaporation are counted among the PVD processes most frequently used for coating tools. Within individual PVD process variants, there are in turn various modifications, such as unpulsed or pulsed magnetron sputtering or unpulsed or pulsed arc evaporation, etc.

The target in the PVD process can consist of a pure metal or of a combination of two or more metals. If the target comprises a plurality of metals, then all these metals are simultaneously incorporated in the layer, built up in the PVD process, of a coating. The relative proportion of the metals to one another in the constructed layer will depend on the proportion of the metals in the target, but will also depend on the conditions in the PVD process, since some metals are released in greater quantities from the target under particular conditions and/or are deposited in greater quantities on the substrate compared with other metals.

To produce specific metal compounds, reactive gases are fed to the reaction chamber of the PVD process, such reactive gases being, for example, nitrogen for producing nitrides, oxygen for producing oxides, carbonaceous compounds for producing carbides or mixtures of these gases for producing corresponding mixed compounds, such as carbonitrides, oxycarbides, etc.

WO 96/23911 A1 describes an anti-wear protective layer on a substrate, consisting of a coat of hard material applied directly to the substrate and a sequence of from 10 to 1000 further individual coats applied thereto, consisting alternately of a metallic hard material and a covalent hard material having a thickness of the individual layers of between 1 and 30 nm. The mechanical and chemical characteristics of the anti-wear protective layer are intended to be improved by the periodically alternating arrangement of individual coats of metallic hard materials and covalent hard materials.

WO 2006/041367 A1 describes a coated cutting tool consisting of a hard metal substrate and a coating which is deposited in the PVD process and comprises at least one coat of TiAlN having a thickness of 1.5 to 5 µm and a residual compressive stress of >4 to 6 GPa. The TiAlN coat is said to adhere more effectively to the substrate compared with known coats.

EP 2 298 954 A1 describes a method for producing a coated cutting tool in which a hard material coating, for example TiAlN, TiAlCrN or TiAlCrSiN, is applied to a substrate by the PVD process, the bias voltage of the substrate being varied during the deposition process. The method is said to provide an improved wear resistance and a longer service life of the tool.

Particularly exacting demands are imposed on the tool in certain metalworking operations, such as milling and turning. Important parameters for tools of this type are a high degree of hardness, a high modulus of elasticity (E modulus, Young's modulus) and a low surface roughness. Known cutting tools for the described uses have a TiAlN coating which is applied in the PVD process and which typically has a modulus of elasticity of less than 400 GPa and a Vickers hardness of up to 3500 HV. When TiAlN layers of this type are deposited in the arc process, due to the low melting temperature of aluminium they tend to form so-called droplets on and in the layer which adversely affects the performance of the coating. A suitable choice of the parameters of the deposition process can increase the hardness and modulus of elasticity in the PVD process, but this generally leads to high residual compressive stresses in the layer of approximately >3 GPa which adversely affects the stability of the cutting edge. When subjected to a high stress, the cutting edge is liable to chip off at an early stage, thereby leading to rapid wear of the tool.

Object

The object of the present invention was to provide a tool which, compared with the prior art, has a better coating with a high degree of hardness, a high modulus of elasticity and, at the same time, acceptable residual stresses and improved stability of the cutting edge.

DESCRIPTION OF THE INVENTION

This object is achieved by a tool comprising a base body made of hard metal, cermet, ceramics, steel or high-speed steel and a single-layer or multi-layer anti-wear protective coating applied thereto in the PVD process, at least one layer of said anti-wear protective coating being a titanium-aluminium-nitride layer, $Ti_xAl_yN$ where $x+y=1$, which layer can contain, according to the process, up to 5% by weight of further metals, the $Ti_xAl_yN$ layer being a multi-coat substructure having a plurality of periodically alternating $Ti_{x(A)}Al_{y(A)}N$ coats (A) where $x(A)+y(A)=1$ and $Ti_{x(B)}Al_{y(B)}N$ coats (B) where $x(B)+y(B)=1$, the Al concentration y(B) in coats (B) amounting to a maximum of 70 at. % (y(B)≤0.70) and the Al concentration y(B) in coats (B) being from 10 to 25 at. % higher than the Al concentration y(A) in coats (A) (y(B)=(y(A)+0.10) to (y(A)+0.25)).

Accordingly, the Ti concentration x(B) in coats (B) is from 10 to 25 at. % lower than the Ti concentration x(A) in coats (A) (x(B)=(x(A)−0.10) to (x(A)−0.25)).

It has surprisingly been found that a TiAlN layer of the type according to the invention, with periodically alternating TiAlN coats having different concentration ratios of Ti to Al compared with conventional TiAlN coats which do not have alternating concentration ratios, has a higher degree of hardness and a higher modulus of elasticity, without the residual compressive stress in the layer increasing considerably at the same time, as is observed in known TiAlN layers of the prior art.

The maximum Al concentration y(B) in coats (B) is 70 at. %. Since the Al concentration y(B) in coats (B) is 10 to 25 at. % higher than the Al concentration y(A) in coats (A), the Al concentration in the entire titanium-aluminium-nitride layer, $Ti_xAl_yN$, is less than 70 at. %. If the concentration of Al is too high, relatively soft phases are disadvantageously formed.

Without the inventors wanting to tie themselves to one theory, it is assumed that the higher proportion of aluminium in coats (B) compared with coats (A) leads to smaller lattice constants in the cubically surface-centred lattices due to the smaller size of aluminium compared with titanium, and thereby leads to a corresponding variation in the residual stress ratios which is demonstrated in a lower residual compressive stress compared with conventional TiAlN coats which are deposited without alternating concentration ratios. The tools according to the invention are distinguished by a higher wear resistance and by a longer service life, and in particular are distinguished by less chipping of the coating at the cutting edge.

The advantageous effect of the coat structure according to the invention of the TiAlN layer is still demonstrated when fewer periodically alternating $Ti_{x(A)}Al_{y(A)}N$ coats (A) and $Ti_{x(B)}Al_{y(B)}N$ coats (B) with different concentration ratios of Ti to Al according to the invention are used. In a preferred embodiment of the invention, the at least one $Ti_xAl_yN$ layer in the anti-wear protective coating has at least 40 periodically alternating TiAlN coats (A) and TiAlN coats (B). Thus, in this embodiment, the entire TiAlN layer comprises at least 40 TiAlN coats (A) and at least 40 TiAlN coats (B), i.e. a total of at least 80 TiAlN coats. The use of less than 40 periodically alternating TiAlN coats (A) and (B) has the disadvantage that the hardness and the modulus of elasticity which are higher according to the invention compared with the prior art are not achieved.

Without the invention being tied to the following theory, it is assumed that the advantages of the invention are based, inter alia, on the fact that locally very restricted high residual stresses build up along the coat alternation at the boundary surfaces between TiAlN coats (A) and (B) which, however, cannot be outwardly measured and do not affect the adhesion of the coating to the substrate. If the number of periodically alternating $Ti_{x(A)}Al_{y(A)}N$ coats (A) and $Ti_{x(B)}Al_{y(B)}N$ coats (B) is too low, the effect achievable by the coat alternation cannot be realised.

In a further preferred embodiment of the invention, the at least one $Ti_xAl_yN$ layer in the anti-wear protective coating has at most 300 periodically alternating TiAlN coats (A) and TiAlN coats (B). Thus, in this embodiment, the entire TiAlN layer comprises at most 300 TiAlN coats (A) and at most 300 TiAlN coats (B), i.e. a total of at most 600 TiAlN coats. The use of more than 300 periodically alternating TiAlN coats (A) and (B) has the disadvantage that they can only be produced commercially with a very high outlay and at a high cost associated therewith.

In a further preferred embodiment of the invention, the $Ti_{x(A)}Al_{y(A)}N$ coats (A) have a thickness within a range of 2 to 40 nm, preferably 4 to 15 nm, and the $Ti_{x(B)}Al_{y(B)}N$ coats (B) have a thickness within a range of 1 to 20 nm, preferably 2 to 7 nm. The TiAlN coats (A) expediently have 1.5 to 3.0 times the thickness, preferably approximately twice the thickness of the TiAlN coats (B). Thus, a thinner TiAlN coat (B) with an increased aluminium content follows a thicker TiAlN coat (A).

Without the invention being tied to the following theory, it is assumed that the advantages of the invention are based, inter alia, on the fact that the thicker $Ti_{x(A)}Al_{y(A)}N$ coats (A) produce a phase stabilisation in the thinner $Ti_{x(B)}Al_{y(B)}N$ coats (B). In the case of the Al-richer $Ti_{x(B)}Al_{y(B)}N$ coats (B), there is the risk that in addition to cubic TiAlN, hexagonal AlN is also produced which has a considerably lower hardness and strength. If these layers remain thin, as in the above-mentioned range, the adjoining Ti-richer thicker $Ti_{x(A)}Al_{y(A)}N$ coats (A) stabilise the cubic TiAlN phase in the Al-richer thinner $Ti_{x(B)}Al_{y(B)}N$ coats (B).

The periodically alternating $Ti_{x(A)}Al_{y(A)}N$ coats (A) and $Ti_{x(B)}Al_{y(B)}N$ coats (B) with differing concentration ratios of Ti to Al according to the invention can be detected by a transmission electrode microscope (TEM) in spite of their low thickness. The technique is sufficiently well known to a person skilled in the field.

In a further preferred embodiment of the invention, the concentration ratio of Ti to Al in the $Ti_{x(A)}Al_{y(A)}N$ coats (A) x(A):y(A) is 0.40:0.60 to 0.60:0.40. More preferably, the concentration ratio x(A):y(A) is 0.45:0.55 to 0.55:0.45, particularly preferably x(A):y(A) is approximately 0.50:0.50. If the Al proportion in the $Ti_{x(A)}Al_{y(A)}N$ coats (A) is too low, the thermal stability of the coating and thus the durability of the tool, for example during metalworking at high temperatures or during changes in temperature, are adversely affected. However, an excessively high Al proportion in the $Ti_{x(A)}Al_{y(A)}N$ coats (A) adversely affects the hardness and modulus of elasticity of the coating.

The TiAlN layer according to the invention is deposited in one or more of the PVD processes mentioned in the following. The variation in the aluminium concentration in the deposited coat can be advantageously achieved in that different TiAl mixed targets are arranged in the PVD installation with differing concentration ratios of Ti to Al and the substrate is guided periodically past the different mixed targets. Corresponding TiAl mixed targets are preferably deposited by arc evaporation, by magnetron, dual magnetron or HIPIMS processes. Suitable mixed targets contain for example Ti and Al in a ratio of 50:50 for coats (A) and for example Ti and Al in a ratio of 33:67 for coats (B). Other concentration ratios in the mixed targets are naturally also possible in order to obtain different concentration ratios of Ti and Al in the deposited coats. Alternatively, instead of the mixed target with an increased aluminium content, pure aluminium targets or targets with a high aluminium content can also be used in the magnetron, dual magnetron or HIPIMS processes. Arc evaporation is less suitable for pure aluminium targets or targets with a high aluminium content, since this PVD process has a high risk of droplet formation due to the low melting point of aluminium.

In a preferred embodiment of the tool according to the invention, the TiAlN layer with a multi-coat substructure is the outermost layer of the anti-wear protective coating which comes into contact with the workpiece during metalworking. Alternatively, further layers of hard material can be provided over the TiAlN layer.

In a further alternative embodiment, provided over the TiAlN layer at least in certain regions is a thin wear detection layer, preferably a TiN or CrN layer with a thickness of 0.1 to 1.5 μm. Wear detection layers of the aforementioned type are known per se and primarily serve as decorative layers and/or they indicate whether and to what extent the tool has already been used and the extent of wear which has occurred during use. The thin wear detection layer is worn away in a detectable manner during use of the tool and when there is relatively intense wear, the underlying, generally different-coloured anti-wear protective layer becomes visible.

In a further preferred embodiment of the tool according to the invention, the TiAlN layer has a Vickers hardness HV of 2500 to 4000 HV 0.015, preferably 3000 to 3500 HV 0.015. The high degree of hardness of the TiAlN layer according to the invention has particular advantages in metalworking, particularly in turning and milling processes, since among the cutting processes which use a geometrically defined cutting edge, these are the ones which have the most exacting demands imposed on the cutting material in respect of hardness, toughness, wear resistance and thermal stability. A hardness which is too low has the disadvantage that the wear resistance of the coating decreases. A hardness which is too high has the disadvantage that the toughness of the coating decreases and the coating becomes brittle.

In a further preferred embodiment of the tool according to the invention, the TiAlN layer has a modulus of elasticity of 380 GPa to 470 GPa, preferably 420 GPa to 460 GPa. When the tool is stressed externally during machining, mechanical stresses are produced in the layer and in the substrate, the extent of said stresses above the modulus of elasticity being associated with the elastic deformation which is introduced. If the modulus of elasticity of the layer is too low, low stresses arise inside the layer upon mechanical deformation of the tool during use, which is associated with the disadvantage that the layer can also only absorb a small proportion of the cutting forces. However, a modulus of elasticity which is too high has the disadvantage that during mechanical deformation, excessively high forces are diverted over the layer, as a result of which said layer can be prematurely destroyed.

As already stated, for specific metalworking uses, in particular turning and milling, most particularly in metalworking uses with an interrupted cut, the combination of a high degree of hardness and a high modulus of elasticity is particularly advantageous. The high degree of hardness ensures a high wear resistance. However, a high degree of hardness is usually accompanied by an increased brittleness. The high modulus of elasticity simultaneously ensures that the material has a relatively low brittleness and for example can better compensate for high mechanical alternating stresses which arise during an interrupted cut. The TiAlN layer according to the invention provides the anti-wear protective coating of the tool with these advantageous characteristics.

Hardness and E-modulus (more precisely so-called reduced E-modulus) are measured by nanoindentation. In this measurement, a diamond test body according to Vickers is pressed into the layer and the force-path curve is recorded during the measurement. From this curve, it is then possible to calculate the mechanical characteristic values of the test body, inter alia hardness and (reduced) E-modulus. To determine the hardness and E-modulus of the layer according to the invention, a Fischerscope® H100 XYp manufactured by Helmut Fischer GmbH, Sindelfingen, Germany was used. It should be noted that the impression depth should not be more than 10% of the layer thickness, otherwise characteristics of the substrate can falsify the measurements.

The residual stresses in the layer according to the invention can be examined by x-ray diffraction. In this respect, a distinction can be made between residual stresses of a first, second and third order, which stresses differ in their range and thus in their effect on the layer adhesion. It has proved advantageous for the adhesion of the layer to the tool if the first and second order residual stresses in the layer do not become excessive, expediently not more than −5 GPa (compressive stress).

In a further preferred embodiment of the tool according to the invention, the TiAlN layer has an average surface roughness Ra, measured over a length of 10 µm, of 1.0 µm, preferably 0.5 µm. A suitable choice of the deposition parameters in the PVD process can produce a significant reduction in the droplet frequency of the deposited TiAlN coats, as a result of which the deposited layer is already provided with a low average surface roughness Ra. Therefore, significantly reduced effort during the subsequent smoothing procedure of the surfaces is sufficient after coating to achieve an optimum condition for machining. Suitable for smoothing the surface of the tool after deposition of the layers are known blasting methods, grinding or brushing methods with correspondingly hard and fine materials.

A suitable process for smoothing the surface of the tool is, for example, wet blasting with glass beads at a pressure of approximately 2.5 bars with a blasting medium consisting of 50% glass beads having a diameter of 70-110 µm and 50% glass beads having a diameter of 40-70 µm. The appropriate blasting duration is determined by examining the desired surface smoothness. The processing time in the case of a solid hard metal milling tool having a diameter of 10 mm is, for example, approximately 10 seconds.

A further suitable method for smoothing the surface of the tool is drag finishing. A suitable abrasive is, for example, a coconut shell granulated material with fine diamond powder as abrasive and adhesive oil.

Wet blasting using corundum with, for example, a grain size of 280/320 and a blasting abrasive concentration in the liquid of approximately 18% is particularly suitable for an after-treatment. Here, a blasting pressure of approximately 1.5 to 2 bars is expediently used, the blasting direction and angle being set subject to the type and size of tool.

The surface roughness was measured on polished test indexable cutter inserts using a measuring device Hommel-ETAMIC TURBO WAVE V7.32 manufactured by HOMMEL-ETAMIC GmbH, Schwenningen, Germany (probe: TKU300-96625_TKU300/TS1; measuring range: 80 µm; test path: 4.8 mm; speed: 0.5 mm/s).

In a further preferred embodiment of the invention, the tool has a rounded cutting edge with an edge radius within a range of 3 to 10 µm, preferably 5 to 7 µm. A cutting edge with too small a radius suffers from the risk that the edge will break off quickly. An excessive cutting edge radius entails very high cutting forces which adversely affect the life of the tool and the chip shapes.

The tool according to the invention can be configured as a coated solid hard metal tool or as a coated indexable cutter insert.

Further advantages, features and embodiments of the present invention will be described in more detail on the basis of the following examples.

EXAMPLES

Example 1

Shank Tools

In this example, solid hard metal (SHM) end mills (so-called "Tough Guys") were provided with a coating according to the invention and with a comparative coating according to the prior art and the coated tools were compared in cutting tests.

Specification of the Solid Hard Metal (SHM) End Mill

| | |
|---|---|
| Diameter: | 10 mm |
| Number of cutting edges: | 4 |
| Length of cutting edges: | 200% of the diameter |
| Spiral angle of the flutes: | 50° |
| Rake angle at the cross cutting edge: | 13.5° |
| Rake angle at the major cutting edge: | 10.5° |
| Substrate material: | Fine grain hard metal with an average WC grain size of 0.8 μm and a binder content of 10% by weight Co |

Before coating, the substrate was initially subjected to a cutting edge rounding procedure to a radius of 7 μm by wet blasting with glass beads.

Production of a Coating According to the Invention

A 0.2 μm thick TiAlN intermediate coat was firstly deposited on the substrate surface by arc evaporation from a Ti—Al mixed target (Ti:Al=50:50) (bias: 100 V, 4 Pa nitrogen, 0.8 A/cm² specific evaporator flow, deposition temperature: 550° C.). Deposited thereon also by arc evaporation was an anti-wear protective coating according to the invention in a total layer thickness of 2 μm. Deposition took place simultaneously from 4 Ti—Al mixed targets with a Ti:Al ratio of 50:50 and from 2 Ti—Al mixed targets with a Ti:Al ratio of 33:67. (Bias: 60 V, 4.5 Pa nitrogen, 0.8 A/cm² specific evaporator flow for both types of target, deposition temperature: 550° C.). The substrate was guided on a rotary table past the different types of target. In all, 90 $Ti_{x(A)}Al_{y(A)}N$ coats (A) where Ti:Al=50:50 and 90 $Ti_{x(B)}Al_{y(B)}N$ coats (B) where Ti:Al=33:67 were deposited in a periodically alternating manner, the $Ti_{x(A)}Al_{y(A)}N$ coats (A) respectively having a thickness of approximately 15-19 nm and the $Ti_{x(B)}Al_{y(B)}N$ coats (B) respectively having a thickness of approximately 3-6 nm. Thereafter, a final outermost coat was also deposited by arc evaporation from a Ti—Al mixed target with a Ti:Al ratio of 33:67, in a layer thickness of 0.1 μm. (Bias: 40 V, 3.0 Pa nitrogen, 0.8 A/cm² specific evaporator flow, deposition temperature: 550° C.).

Production of a Comparative Coating

A single-layer TiAlN anti-wear protective coating was deposited by arc evaporation on the substrate surface in a total layer thickness of 2.5 μm from Ti—Al mixed targets with a Ti:Al ratio of 33:67 (bias: 80 V, 1.5 Pa nitrogen, deposition temperature: 550° C., 2 A/cm² specific evaporator flow).

Cutting Tests 1

The coated tools were compared in milling tests and the average flank wear $V_b$ and the maximum flank wear $V_{bmax}$ were determined as averages from two tests in each case. The results of the tests are stated in the following table 1.

| | |
|---|---|
| Workpiece: | 42CrMo4 steel No. 1.7225, hardened and tempered to approximately. 850 N/mm². |
| Cutting conditions: | tooth feed $f_z$ = 0.07 mm |
| | Cutting speed $v_c$ = 170 m/min |
| | Cutting width $a_e$ = 4 mm |
| | Cutting depth $a_p$ = 8 mm |
| | Cooling with CL 5% |
| | (=cooling lubricant water-in-oil emulsion with 5% oil) |

Machining was interrupted at an average flank wear of $V_b$>0.2 mm or at a maximum flank wear $V_{bmax}$>0.25 mm and was then identified in the results by (./.).

TABLE 1

| | Tool life distance/m | | | | |
|---|---|---|---|---|---|
| | 75 | 150 | 225 | 300 | 375 |
| $V_b$/mm Invention | 0.06 | 0.07 | 0.07 | 0.08 | 0.10 |
| $V_b$max/mm Invention | 0.08 | 0.13 | 0.15 | 0.21 | 0.21 |
| $V_b$/mm Comparison | 0.08 | 0.08 | 0.08 | ./. | ./. |
| $V_b$max/mm Comparison | 0.15 | 0.15 | 0.20 | ./. | ./. |

Example 2

Shank Tools

In this example, solid hard metal (SHM) end mills (so-called "Tough Guys") were provided with a coating according to the invention and with a comparative coating according to the prior art exactly as in example 1 and the coated tools were compared in cutting tests. Only the coated end mill had a different shape compared with Example 1.

Before coating, the substrate was also initially subjected to a cutting edge rounding procedure to a radius of 7 μm by wet blasting with glass beads.

Specification of the Solid Hard Metal (SHM) End Mill

| | |
|---|---|
| Diameter: | 3 mm |
| Number of cutting edges: | 3 |
| Length of cutting edges: | 200% of the diameter |
| Spiral angle of the flutes: | 50° |
| Rake angle at the cross cutting edge: | 13.5° |
| Rake angle at the major cutting edge: | 10.5° |
| Substrate material: | Fine grain carbide with an average WC grain size of 0.8 μm and a binder content of 10% by weight Co |

Cutting Tests 2

The coated tools were compared in milling tests and the average flank wear $V_b$ and the maximum flank wear $V_{bmax}$ were determined as averages from two tests in each case. The results of the tests are stated in the following table 2.

| | |
|---|---|
| Workpiece: | C45 steel No. 1.0503, strength approx. 600 N/mm². |
| Cutting conditions: | tooth feed $f_z$ = 0.02 mm |
| | Cutting speed $v_c$ = 141 m/min |
| | Cutting width $a_e$ = 1.2 mm |
| | Cutting depth $a_p$ = 2.4 mm |
| | Cooling with CL 5% |
| | (=cooling lubricant water-in-oil emulsion with 5% oil) |

Machining was interrupted at an average flank wear of $V_b$>0.2 mm or at a maximum flank wear $V_{bmax}$>0.25 mm and was then identified in the results by (./.).

TABLE 2

| | Tool life distance/m | | | | |
|---|---|---|---|---|---|
| | 20 | 40 | 60 | 80 | 100 |
| $V_b$/mm Invention | 0.04 | 0.06 | 0.07 | 0.07 | 0.07 |

TABLE 2-continued

| | Tool life distance/m | | | | |
|---|---|---|---|---|---|
| | 20 | 40 | 60 | 80 | 100 |
| $V_b$max/mm Invention | 0.05 | 0.08 | 0.09 | 0.09 | 0.10 |
| $V_b$/mm Comparison | 0.06 | ./. | ./. | ./. | ./. |
| $V_b$max/mm Comparison | 0.11 | ./. | ./. | ./. | ./. |

Example 3

Shank Tools

The tool substrate coated in this example was the same as in example 1. A 0.2 µm thick TiAlN intermediate coat was likewise firstly deposited on the substrate surface by arc evaporation from a Ti—Al mixed target (Ti:Al=50:50) (bias: 100 V, 4 Pa nitrogen, 0.8 A/cm² specific evaporator flow, deposition temperature: 550° C.).

In contrast to example 1, the anti-wear protective coating according to the invention was deposited in a total layer thickness of 2 µm from 2 Ti—Al mixed targets with a Ti:Al ratio of 50:50 by arc evaporation (2 A/cm2 specific evaporator flow) and the aluminium content was increased in the TiAlN coat (B) periodically alternating with TiAlN coat (A) using 2 Al targets by dual magnetron sputtering (13 W/cm² specific power) (bias: 80 V, 1.5 Pa nitrogen, deposition temperature: 550° C.). In example 2 as well, 90 $Ti_{x(A)}Al_{y(A)}N$ coats (A) where Ti:Al=50:50 and 90 $Ti_{x(B)}Al_{y(B)}N$ coats (B) where Ti:Al=33:67 were deposited in a periodically alternating manner, the TiAlN coats (A) each having a thickness of approximately 15-19 nm and the TiAlN coats (B) each having a thickness of approximately 3-6 nm.

Example 4

Indexable Cutter Inserts

In this example, indexable cutter inserts P2808, having a square basic shape, consisting of 42CrMo4 steel with a strength of 880 N/mm² were provided with a coating according to the invention and with a comparative coating according to the prior art and the coated tools were compared in cutting tests.

Before coating, the substrate was initially subjected to a cutting edge rounding procedure to a radius of 30 µm by wet blasting with corundum (as described above).

Production of a Coating According to the Invention

A 0.2 µm thick TiAlN intermediate coat was firstly deposited on the substrate surface by arc evaporation from a Ti—Al mixed target (Ti:Al=50:50) (bias: 100 V, 4 Pa nitrogen, 1.0 A/cm² specific evaporator flow, deposition temperature: 550° C.). Deposited thereon, also by arc evaporation, was an anti-wear protective coating according to the invention in a total layer thickness of 2 µm. Deposition took place simultaneously from 4 Ti—Al mixed targets with a Ti:Al ratio of 50:50 and from 2 Ti—Al mixed targets with a Ti:Al ratio of 33:67. (Bias: 60 V, 4 Pa nitrogen, 1.0 A/cm² specific evaporator flow for both types of target, deposition temperature: 550° C.). The substrate was guided on a rotary table past the different types of target. In all, 90 $Ti_{x(A)}Al_{y(A)}N$ coats (A) where Ti:Al=50:50 and 90 $Ti_{x(B)}Al_{y(B)}N$ coats (B) where Ti:Al=33:67 were deposited in a periodically alternating manner, the $Ti_{x(A)}Al_{y(A)}N$ coats (A) each having a thickness of approximately 15-19 nm and the $Ti_{x(B)}Al_{y(B)}N$ coats (B) each having a thickness of approximately 3-6 nm. Thereafter, a final outermost coat was also deposited by arc evaporation from a Ti—Al mixed target with a Ti:Al ratio of 33:67 in a layer thickness of 0.1 µm. (Bias: 40 V, 3.0 Pa nitrogen, 0.8 A/cm² specific evaporator flow, deposition temperature: 550° C.).

Production of a Comparative Coating

A multi-coat (60 coats) TiAlN anti-wear protective coating was deposited by arc evaporation on the substrate surface in a total layer thickness of 4.0 µm from Ti—Al mixed targets with a Ti:Al ratio of 33:67 (deposition temperature: 450° C., 0.8 A/cm² specific evaporator flow). Pressure and bias were varied from 30 V and 5 Pa nitrogen to 60 V and 2 Pa nitrogen. Subsequently, a 0.1 µm thick TiN decorative coat was deposited from Ti targets with 0.8 Pa nitrogen, 0.8 A/cm² specific evaporator flow and a bias of 100 V.

Cutting Tests 3

The coated tools were compared in milling tests and the maximum flank wear $V_{bmax}$ was determined as an average from two tests in each case. The results of the tests are stated in the following table 3.

| Workpiece: | 42CrMo4 steel No. 1.7225, hardened and tempered to approximately 850 N/mm². |
|---|---|
| Cutting conditions: | feed $v_f$ = 120 mm/min |
| | tooth feed $f_z$ = 0.2 mm |
| | Cutting speed $v_c$ = 235 m/min |
| | Milling path 6 × 800 mm |
| | Milling without cooling |

TABLE 3

| | Tool life distance/mm | | | | | |
|---|---|---|---|---|---|---|
| | 800 | 1600 | 2400 | 3200 | 4000 | 4800 |
| $V_b$max/mm Invention | 0.02 | 0.03 | 0.05 | 0.08 | 0.08 | 0.09 |
| $V_b$max/mm Comparison | 0.04 | 0.08 | 0.12 | 0.12 | 0.14 | 0.17 |

The invention claimed is:

1. Tool, comprising:
   a base body made of hard metal, cermet, ceramics, steel or high-speed steel; and
   a single-layer or multi-layer anti-wear protective coating applied thereto in a PVD process,
   wherein at least one layer of said anti-wear protective coating is a titanium-aluminium-nitride layer, $Ti_xAl_yN$ where x+y=1, which layer can contain, according to the process, up to 5% by weight of further metals
   wherein the $Ti_x Al_yN$ layer is a multi-coat substructure comprising at least 40 and at most 300 periodically alternating $Ti_{x(A)}Al_{y(A)}N$ coats (A) where x(A)+y(A)=1 and $Ti_{x(B)}Al_{y(B)}N$ coats (B) where x(B)+y(B)=1,
   wherein the Al concentration y(B) in coats (B) amount at most to 70 at. % (y(B)≤0.70),
   wherein the Al concentration y(B) in coats (B) are from 10 to 25 at. % higher than the Al concentration y(A) in coats (A) (y(B)=(y(A)+0.10) to (y(A)+0.25)),
   wherein a concentration ratio of Ti to Al in the $Ti_{x(A)}Al_{y(A)}N$ coats (A) x(A):y(A) is 0.40:0.60 to 0.60:0.40,
   wherein the $Ti_x Al_yN$ layer has a Vickers hardness HV of 2500 to 4000, an average surface roughness Ra, measured over a length of 10 µm, of 1.0 µm and a modulus of elasticity (E-modulus) of 380 GPa to 470 GPa, and wherein the $Ti_{x(B)}Al_{y(B)}N$ coats (B) layer includes a cubic TiAlN phase.

2. Tool according to claim 1, wherein the $Ti_{x(A)}Al_{y(A)}N$ coats (A) have a thickness within a range of 2 to 40 nm, and the $Ti_{x(B)}Al_{y(B)}N$ coats (B) have a thickness within a range of 1 to 20 nm.

3. Tool according claim 2, wherein the $Ti_{x(A)}Al_{y(A)}N$ coats (A) have 1.5 to 3.0 times the thickness of the $Ti_{x(B)}Al_{y(B)}N$ coats (B).

4. Tool according to claim 1, wherein the $Ti_xAl_yN$ layer with a multi-coat substructure is the an outermost layer of the anti-wear protective coating and optionally has at least in certain regions a superimposed thin wear detection layer with a thickness of 0.1 to 1.5 µm.

5. Tool according to claim 1, wherein the tool is a solid hard metal tool or an indexable cutter insert.

6. Tool according to claim 2, wherein the thickness of the $Ti_{x(A)}Al_{y(A)}N$ coats (A) is within a range of 4 to 15 nm and the thickness of the $Ti_{x(B)}Al_{y(B)}N$ coats (B) is within a range of 2 to 7 nm.

7. Tool according to claim 1, wherein the $Ti_{x(A)}Al_{y(A)}N$ coats (A) have 1.5 to 3.0 times the thickness of the $Ti_{x(B)}Al_{y(B)}N$ coats (B).

8. Tool according to claim 1, wherein the concentration ratio of Ti to Al in the $Ti_{x(A)}Al_{y(A)}N$ coats (A) x(A):y(A) is 0.45:0.55 to 0.55:0.45.

9. Tool according to claim 8, wherein the concentration ratio of Ti to Al in the $Ti_{x(A)}Al_{y(A)}N$ coats (A) x(A):y(A) is approximately 0.50:0.50.

10. Tool according to claim 4, wherein the superimposed thin wear detection layer is a TiN or ZrN layer.

11. Tool according to claim 1, wherein the $Ti_xAl_yN$ layer has a Vickers hardness HV of 3000 to 3500.

12. Tool according to claim 1, wherein the $Ti_xAl_yN$ layer has an average surface roughness Ra, measured over a length of 10 µm, of ≤0.5 µm.

13. Tool according to claim 1, wherein the $Ti_xAl_yN$ layer has a modulus of elasticity (E-modulus) of 420 GPa to 460 GPa.

* * * * *